US008957724B2

(12) United States Patent
Pavlin et al.

(10) Patent No.: US 8,957,724 B2

(45) Date of Patent: Feb. 17, 2015

(54) LOW ELECTROMAGNETIC EMISSION DRIVER

(75) Inventors: Antoine Pavlin, Puyricard (FR); Philippe Bienvenu, Allauch (FR)

(73) Assignee: STMicroelectronics (Rousset) SAS, Rousset (FR)

( * ) Notice: Subject to any disclaimer, the term of this patent is extended or adjusted under 35 U.S.C. 154(b) by 41 days.

(21) Appl. No.: 13/243,268

(22) Filed: Sep. 23, 2011

(65) Prior Publication Data

US 2012/0081092 A1 Apr. 5, 2012

(30) Foreign Application Priority Data

Oct. 1, 2010 (EP) .................................... 10306072

(51) Int. Cl.

*H03K 17/687* (2006.01)

*G05F 1/46* (2006.01)

(52) U.S. Cl.

CPC ........................................ *G05F 1/46* (2013.01)

USPC .......................................................... 327/427

(58) Field of Classification Search

USPC ................. 327/427, 434, 108, 109, 111, 112; 326/82, 83, 86, 87, 88

See application file for complete search history.

(56) References Cited

U.S. PATENT DOCUMENTS

| | | | | |
|---|---|---|---|---|
| 6,028,491 | A | 2/2000 | Stanchak et al. | |
| 6,275,112 | B1 | 8/2001 | Muza | |
| 6,831,502 | B1 * | 12/2004 | Ooishi | 327/541 |
| 7,034,600 | B2 * | 4/2006 | Scheikl | 327/376 |
| 7,408,398 | B2 * | 8/2008 | Sander | 327/427 |
| 7,449,958 | B1 | 11/2008 | Voo | |
| 7,511,540 | B2 * | 3/2009 | Dickman et al. | 327/108 |
| 7,626,428 | B2 * | 12/2009 | Matsuki | 327/108 |
| 8,040,165 | B2 * | 10/2011 | Azetsuji | 327/112 |
| 8,305,122 | B2 * | 11/2012 | Sakaguchi | 327/170 |
| 2001/0040470 | A1 * | 11/2001 | Brando et al. | 327/109 |
| 2002/0008567 | A1 * | 1/2002 | Henry | 327/536 |
| 2007/0103133 | A1 * | 5/2007 | Joos et al. | 323/282 |

* cited by examiner

*Primary Examiner* — Jessica Han

*Assistant Examiner* — Afework Demisse

(74) *Attorney, Agent, or Firm* — Seed IP Law Group PLLC

(57) ABSTRACT

The disclosure concerns circuitry for controlling a power transistor of a drive circuit arranged to drive an electrical component, the circuitry comprising: a variable current source adapted to set the level of a current for charging a control terminal of said power transistor; and a control circuit adapted to control said variable current source in a continuous manner based on a feedback voltage.

23 Claims, 4 Drawing Sheets

LOW ELECTROMAGNETIC EMISSION DRIVER

BACKGROUND

1. Technical Field

The present disclosure relates in general to a circuit for driving a load, and in particular to a circuit having low electromagnetic emissions, for example for use in automotive applications.

2. Description of the Related Art

In many electrical applications in the automotive industry, electrical components, such as lamps or heating coils, are powered using a pulse width modulated (PWM) signal, allowing the power levels to be controlled relatively precisely.

In such applications, there is a desire to minimize electromagnetic emissions, which may interfere with communications equipment such as radio receivers. For example, the CISPR 25 (International Special Committee on Radio Interference) standard introduces strict limits on permissible electromagnetic emissions.

In order to reduce electromagnetic emissions in sensitive frequency bands, the frequency of the PWM signal used for driving the electrical components is generally kept low, for example at between 50 and 400 Hz.

It has also been proposed to control, in a discrete fashion, the rise and fall of the power levels supplied to the electrical components at the rising and falling edges of a PWM signal.

FIGS. 1 and 2 reproduce FIGS. 13 and 12 respectively of patent publication US 2007/0103133.

FIG. 1 illustrates a circuit 100 comprising a lamp forming a load, which receives a voltage Ua supplied by voltage KL30 via a power switch S1. The gate of switch S1 is coupled via a switch 102 to a node 104, and via a switch 106 to a node 108. Node 104 is in turn coupled to a positive supply voltage +UH via the parallel connection of three fixed current sources I1, I2 and I3, wherein the branches of current sources I2 and I3 can be selectively activated by further switches. Similarly, node 108 is in turn coupled to a ground voltage via the parallel connection of a further three current sources I1', I2' and I3', wherein the branches of current sources I2' and I3' can be selectively activated by further switches.

Three comparators Cmp1, Cmp2 and Cmp3 control the switches for activating the branches of current sources I2, I3, I2' and I3'. Comparator Cmp1 compares the gate voltage Ug of the power switch S1 with a threshold voltage, while comparators Cmp2 and Cmp3 compare the output voltage Ua with corresponding threshold voltages. The outputs of comparators Cmp1 and Cmp2 are provided to an AND gate, the output of which controls the switches in the branches of current sources I3 and I3', while the output of comparator Cmp3 controls the switches in the branches of current sources I2 and I2'.

FIG. 2 shows a timing diagram 202 illustrating a PWM signal over time, a timing diagram 204 illustrating the output voltage Ua as a percentage of the supply voltage Ubat, and a timing diagram 206 illustrating the resulting current supplied to the gate of switch S1.

Upon activation of the PWM signal as shown in timing diagram 202, the output voltage Ua initially stays low, and thus the three current sources I1, I2 and I3 are activated. Then, at a time t1, the output voltage Ua starts to increase, and the current is reduced to the value of just I1. When the output voltage reaches 10% of the supply voltage KL30, the second supply current I2 is activated, and when the voltage reaches 20% of the supply voltage KL30, all the current sources I1, I2 and I3 are activated. Then, when the output voltage reaches 80% of the supply voltage KL30, the current source 13 is disabled, and when the output voltage reaches 90% if the supply voltage KL30, the current is reduced to just that of current source I1. During the descent, the reverse control sequence is performed based on the current sources I1', I2' and I3', which discharge the gate to ground.

BRIEF SUMMARY

One embodiment of the present disclosure reduces electromagnetic emissions with respect to the circuit of FIG. 1, and provides a less complex solution providing an improved compromise between electromagnetic emissions and switching losses.

According to one aspect of the present disclosure, there is provided circuitry for controlling a power transistor of a drive circuit arranged to drive an electrical component, the circuitry comprising: a variable current source adapted to set the level of a current for charging a control terminal of said power transistor; and a control circuit adapted to control said variable current source in a continuous manner based on a feedback voltage.

According to one embodiment, said control circuit is adapted to control said variable current source to generate a monotonically increasing current for charging said control terminal.

According to one embodiment, said variable current source is adapted to set, based on a single continuous control signal, both the level of said current for charging said control terminal of said power transistor and the level of a current for discharging said control terminal of said power transistor.

According to one embodiment, said control circuit is adapted to control said variable current source to generate a monotonically decreasing current for discharging said control terminal.

According to one embodiment, the circuitry further comprises a first current mirror arranged to supply said current for charging said control terminal of said power transistor based on the current through said variable current source, and a second current mirror arranged to supply said current for discharging said control terminal of said power transistor based on the current through said variable current source.

According to one embodiment, said variable current source consists of a transistor.

According to one embodiment, said variable current source comprises a first transistor having a control terminal coupled to receive a control signal from said control circuit, and a fixed current source coupled in parallel with said first transistor.

According to one embodiment, said control circuit comprises at least one resistor arranged to convert said feedback voltage into a feedback current level, and a current mirror for setting the level of current through the variable current source based on said feedback current level.

According to one embodiment, said control circuit comprises an operational amplifier adapted to provide an output signal proportional to said feedback voltage.

According to one embodiment, said feedback voltage is one of: the voltage level supplied by said power transistor; and the voltage at the control terminal of said power transistor.

According to one embodiment, said current for charging a control terminal of said power transistor is equal to I_START+L($V_{REF}$), where I_START is a constant starting current value, L is a constant and $V_{REF}$ is a voltage level equal to said feedback voltage or proportional to said feedback voltage.

According to one embodiment, the circuitry comprises first and second switches arranged to control the charging and discharging of said control terminal of said power transistor based on a pulse width modulation signal.

According to one aspect of the present disclosure, there is provided an electronic circuit comprising a PWM signal generator and the above circuitry arranged to drive a load based on a PWM signal generated by said generator.

According to yet another aspect of the present disclosure, there is provided a method of controlling a power transistor of a drive circuit to drive an electrical component, the method comprising: setting, by a variable current source, the level of a current for charging a control terminal of said power transistor; and controlling said variable current source in a continuous manner based on a feedback voltage.

BRIEF DESCRIPTION OF THE SEVERAL VIEWS OF THE DRAWINGS

The foregoing and other purposes, features, aspects and advantages of the disclosure will become apparent from the following detailed description of embodiments, given by way of illustration and not limitation with reference to the accompanying drawings, in which.

DETAILED DESCRIPTION

In the following description, only those aspects useful for an understanding of the disclosure will be described in detail. Other features, such as the particular applications of the disclosure, will not be described in detail, the disclosure being applicable to a broad range of applications.

Figure 3:
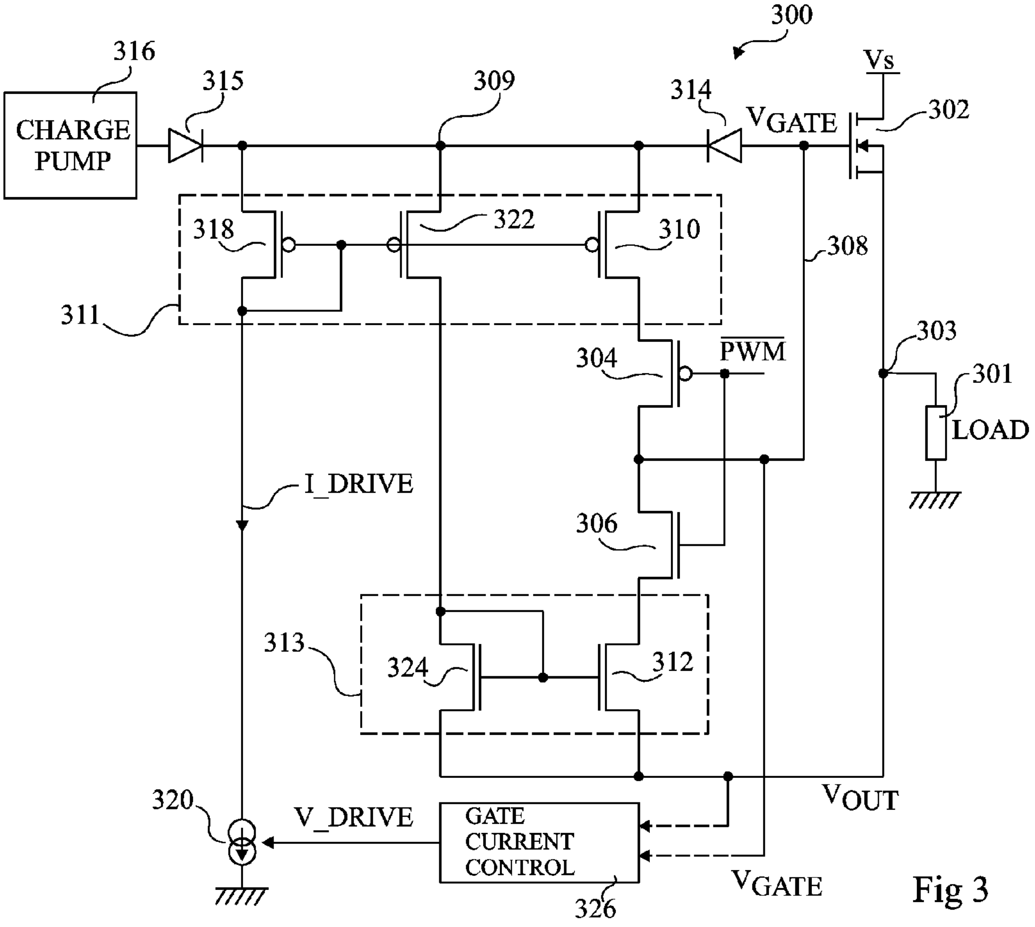
FIG. 3 illustrates circuitry for driving a load according to an embodiment of the present disclosure.

FIG. 3 illustrates a drive circuit 300 for driving a load 301, which is for example predominately resistive. The load is for example a lamp such as a car headlight or brake light, which could be an incandescent or LED (light emitting diode) lamp, or another type of load such as a heating coil.

The load 301 is coupled to an output node 303 of the drive circuit, node 303 being in turn coupled to a supply voltage Vs via a power transistor 302, which in this example is an N-channel MOS transistor. The supply voltage Vs is for example provided by a battery (not shown), and for example has a value of between 8 and 16 volts depending on the charge state of the battery. Alternatively, a different power source could be used.

The gate voltage $V_{GATE}$ of NMOS 302 is charged by a current supplied via a complementary pair of transistors 304, 306, and via a line 308. In particular, line 308 is coupled between the gate of transistor 302 and the drains of transistors 304 and 306. The gates of transistors 304, 306 are coupled to receive the inverse $\overline{PWM}$ of a PWM signal.

Transistor 304 is a PMOS transistor, and has its source coupled to a supply node 309 via a PMOS transistor 310 forming one branch of a current mirror 311.

Transistor 306 is an NMOS transistor having its source coupled to the output node 303 via an NMOS transistor 312 that forms one branch of a current mirror 313.

The supply node 309 is coupled via a diode 314 to the gate node of NMOS transistor 302, and via a diode 315 to the output of a charge pump 316. In particular, diodes 314 and 315 have their cathodes coupled to node 309.

The current mirror 311 comprises a further branch comprising a PMOS transistor 318 having its source coupled to node 309, and its drain coupled to a variable current source 320, which is in turn coupled to ground.

Transistor 318 has its drain coupled to its gate, such that, when transistor 304 is activated, the current through the transistor 310 matches or is proportional to the current I_DRIVE set by the variable current source 320. The current mirror 311 further comprises a branch comprising a PMOS transistor 322, having its source coupled to node 309, and its drain coupled to the drain of an NMOS transistor 324 of current mirror 313.

Similarly, transistor 324 of current mirror 313 has its drain coupled to its gate, such that, when transistor 306 is activated, the current through transistor 312 matches or is proportional to the current through transistor 322, and thus the current I_DRIVE.

The variable current source 320 is controlled by a gate current control block 326, which receives as a feedback voltage either the voltage $V_{OUT}$ from the output node 303 of the circuit, or the gate voltage $V_{GATE}$ from a gate node of NMOS 302. The gate current control block 326 advantageously provides a single, continuous control signal V_DRIVE for controlling the variable current source, rather than discrete control signals, as will be described in more detail below.

For example, the current for charging the gate of NMOS 302 is equal to I_START+L($V_{REF}$), where I_START is a constant starting current value, L is a constant and $V_{REF}$ is a voltage level equal to either the feedback voltage $V_{OUT}$ or $V_{GATE}$, or a voltage level proportional to one of the feedback voltages.

Operation of the circuitry of FIG. 3 will now be described in more detail with reference to the timing diagrams of FIG. 4.

Figure 4:
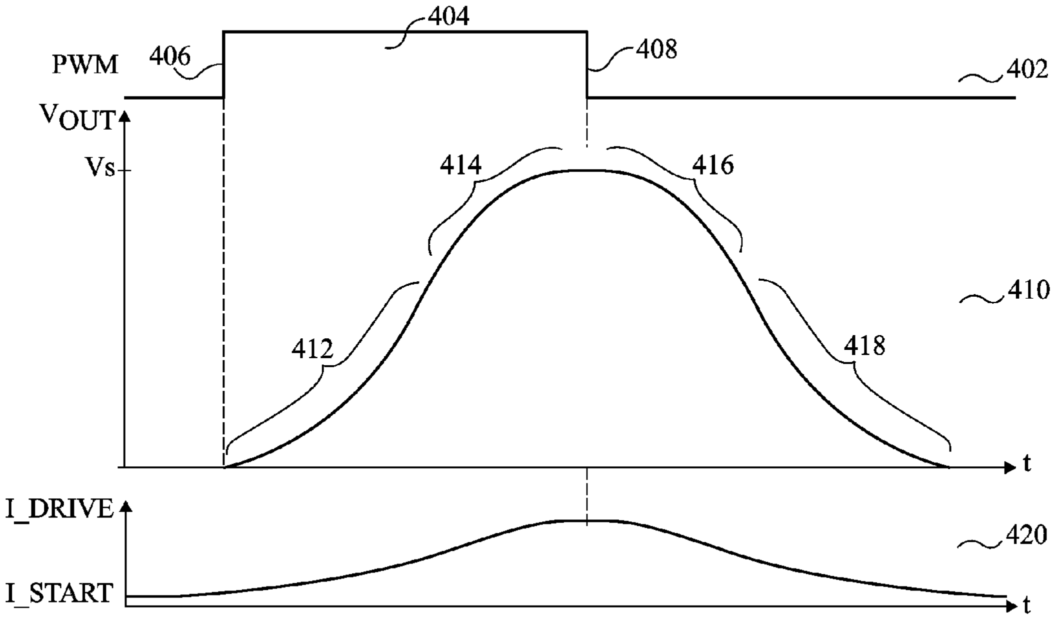
FIG. 4 shows timing diagrams corresponding to examples of signals of the circuit of FIG. 3.

FIG. 4 illustrates, in a first timing diagram 402, the timing of a PWM signal, the inverse of which is provided to the gate nodes of transistors 304 and 306 of FIG. 3. A positive square pulse 404 has a rising edge 406 and a falling edge 408.

A second timing diagram 410 illustrates the output voltage $V_{OUT}$ at the node 303 of FIG. 3 as a function of time. It should be noted that the output current, or the output power provided to the load would have a similar form.

As illustrated, the output voltage $V_{OUT}$ starts low, for example at 0 V, before the PWM signal has been asserted. In this state, the transistor 306 is active.

Then, at the rising edge 406 of the PWM signal, transistor 306 is deactivated, and transistor 304 is activated, thereby injecting the current I_DRIVE via transistors 312, 306 and line 308 to the gate node of transistor 302. This causes the output voltage $V_{OUT}$ to rise initially exponentially and then linearly, as shown labelled 412 in diagram 410. Then, as the output voltage nears the supply voltage Vs, the transistor enters its ohmic region, in which the on state resistance is modulated by the gate-source voltage, causing the rate of increase of the output voltage to tail off, as shown by the curve portion labelled 414. The output voltage flattens out at a value for example just below the supply voltage Vs, even if the gate drive capability remains at its maximum value. This ensures low switching losses whilst keeping a smooth voltage curve leading to very low electromagnetic emissions.

Next, at the falling edge 408 of the PWM signal, the transistor 304 is deactivated, and transistor 306 is activated. Thus current I_DRIVE now discharges the gate of NMOS 302. As illustrated in the portion of the curve labelled 416, the fall of the output voltage $V_{OUT}$ is slow to begin with, as the transistor 302 leaves its on state resistance modulation region, but the voltage fall accelerates quickly in a symmetrical fashion with respect to the turn-on voltage rise. Then, as shown by the portion of curve labelled 418, due to the falling discharge current, the output voltage follows an exponential decay until a low value, such as 0 V, is again reached.

The timing diagram 420 of FIG. 4 illustrates the current I_DRIVE that charges and discharges the gate of transistor 302. As illustrated, the current starts at a minimum value I_START, for example equal to around 10 μA. It then for example follows a similar curve to the output voltage, peaking at a value corresponding to the platform of the output voltage $V_{OUT}$. Thus it should be noted that the current I_DRIVE does not fall as the output voltage nears its peak, but stays at its maximum value. Only the current delivered to the gate of transistor 302 starts to reduce as the gate voltage approaches the charge pump output voltage, causing the current source 310 to saturate.

It can be seen that the current monotonically increases during the charging of the gate of NMOS 302, and monotonically decreases during the discharging of the gate of NMOS 302.

Examples of alternative implementations of the gate current control block 326 of FIG. 3 will now be described with reference to FIGS. 5A to 5D.

Figure 5A:
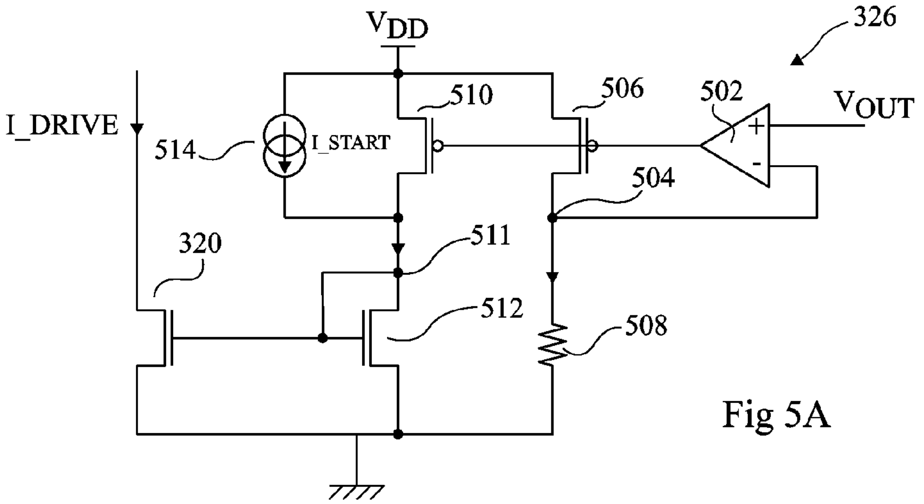
FIGS. 5A to 5D illustrate alternative embodiments of a gate current control block of the circuit of FIG. 3.

FIG. 5A illustrates the variable current source 320, in this example implemented by a single NMOS transistor. The control block 326 comprises an operational amplifier 502, which receives at a positive input the output voltage $V_{OUT}$, and at a negative input a varying reference voltage at a node 504. The output of the operation amplifier 502 is coupled to the gate of a PMOS transistor 506, which is coupled between a supply voltage $V_{DD}$, for example equal to Vs or another internally regulated supply, and node 504. A resistor 508 is coupled between node 504 and ground. A further PMOS transistor 510 is coupled between supply voltage $V_{DD}$ and a node 511, and a fixed current source 514 is coupled in parallel between $V_{DD}$ and node 511. Current source 514 conducts the current I_START. Node 511 is coupled to ground via an NMOS transistor 512, which has its drain and gate coupled together and to the gate of transistor 320. Thus transistors 320 and 512 form a current mirror, meaning that a current I_DRIVE flowing through transistor 320 is equal to $K(I\_START+V_{OUT}/R)$, where K is a constant that depends on the ratio between transistors 320 and 512, and R is the resistance of resistor 508.

Figure 5B:
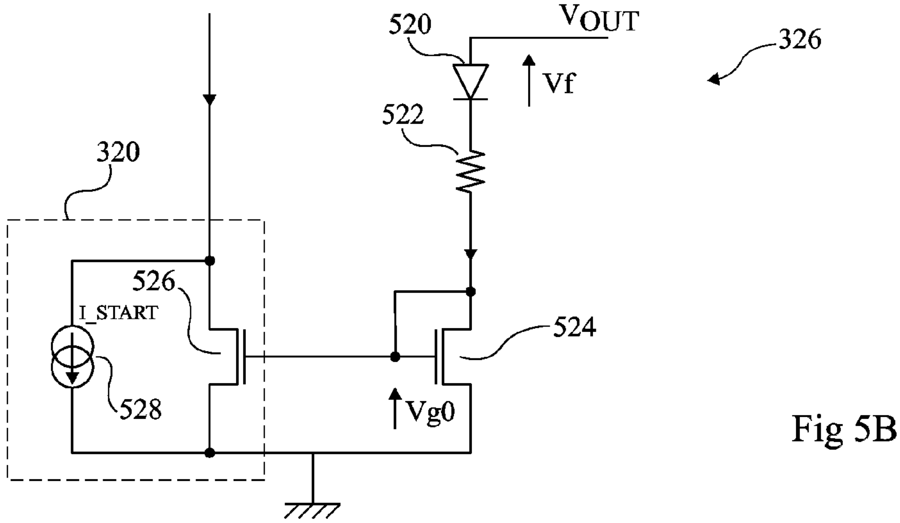

FIG. 5B illustrates an alternative embodiment in which the output voltage $V_{OUT}$ is coupled to the anode of a diode 520, the cathode being coupled to a resistor 522, which is in turn coupled to ground via a transistor 524. The variable current source 320 in this example comprises an NMOS transistor 526 coupled in parallel with a fixed current source 528, which conducts the current I_START. Transistor 524 has its gate and drain terminals coupled together, its gate terminal further being coupled to the gate of transistor 526. Thus transistors 524 and 526 together form a current mirror such that the current through transistor 526 matches or is proportional to the current through resistor 522. The total current I_DRIVE through the variable current source 320 is thus equal to $I\_START+K(V_{OUT}-Vo)/R$, where R is resistance of resistor 522, and Vo is equal to Vf+Vg0, where Vf is the voltage drop across the diode, and Vg0 is the gate voltage of transistor 524.

Figure 5C:
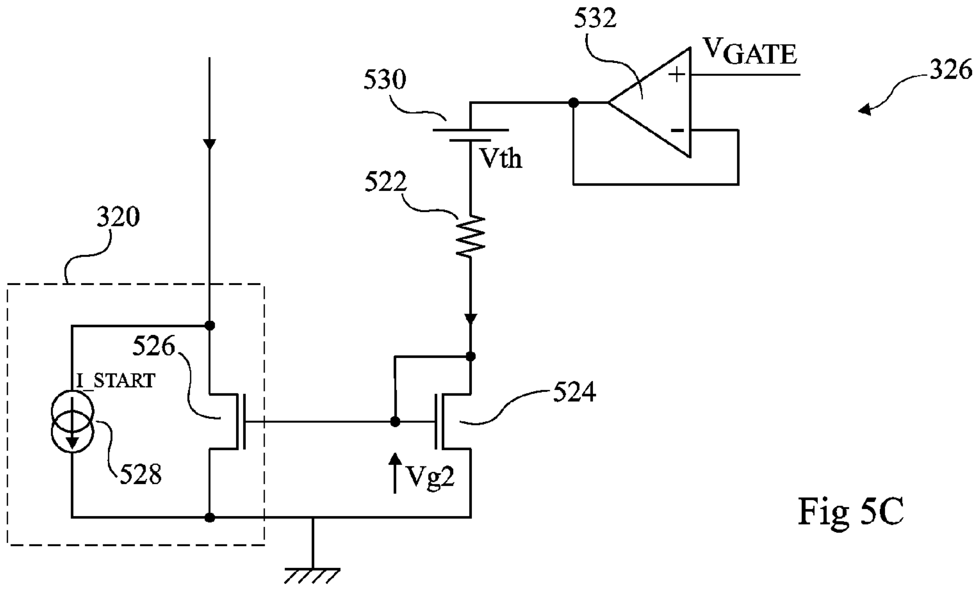

FIG. 5C illustrates a further embodiment of the circuitry 326, which is the same as that of FIG. 5B, except that the diode 520 is replaced by a voltage offset 530 positioned between resistor 522 and the output of an operational amplifier 532. The positive input of operational amplifier 532 receives the gate voltage $V_{GATE}$ of the NMOS transistor 302 of FIG. 3, and the negative input is coupled to the output of the operational amplifier 532. The voltage offset 530 has a value of Vth. In this embodiment, the current through resistor 522 is equal to $(V_{GATE}-V1)/R$, where V1 is equal to Vth+Vg2, where Vg2 is the source-gate voltage of transistor 524. Thus, in this example, the output current I_DRIVE is equal to $I\_START+K(V_{GATE}-V1)/R$.

Figure 5D:
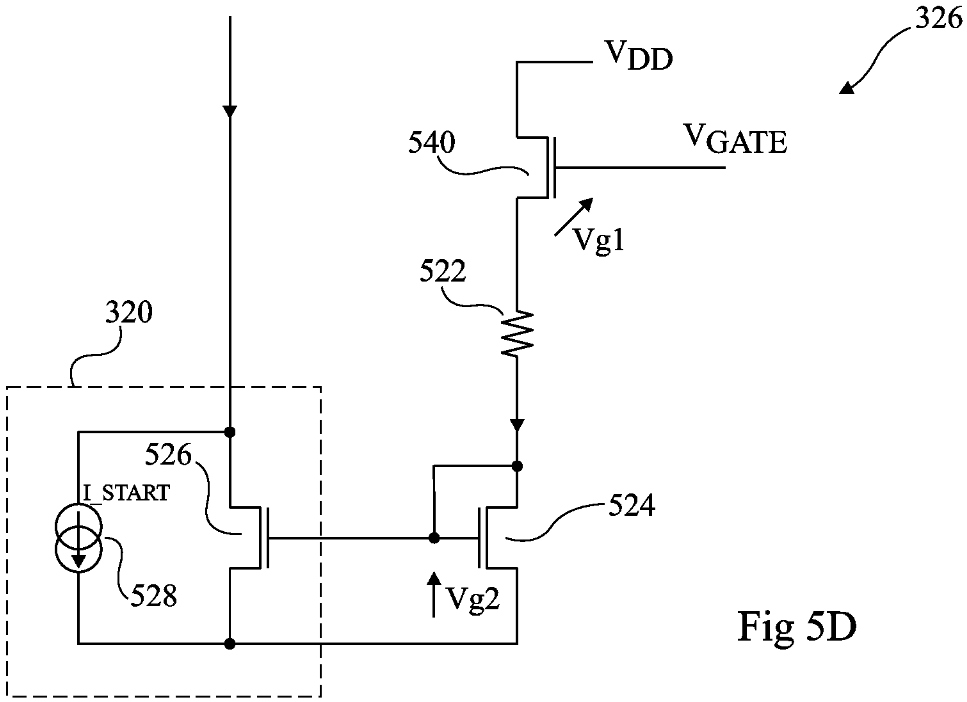

FIG. 5D illustrates yet a further example, similar to the embodiment of FIG. 5C, except that the operational amplifier 532 and voltage offset 530 are replaced by an NMOS transistor 540 coupled between $V_{DD}$ and the resistor 522. The gate of transistor 540 receives the gate voltage $V_{GATE}$ of NMOS 302. The current through the resistor 522 is thus equal to $(V_{GATE}-V1)/R$, where V1 is now equal to Vg1+Vg2, wherein Vg1 is the source-gate voltage of transistor 540, and Vg2 is the source-gate voltage of transistor 524, and again the output current I_DRIVE is equal to $I\_START+K(V_{GATE}-V1)/R$.

Figure 6:
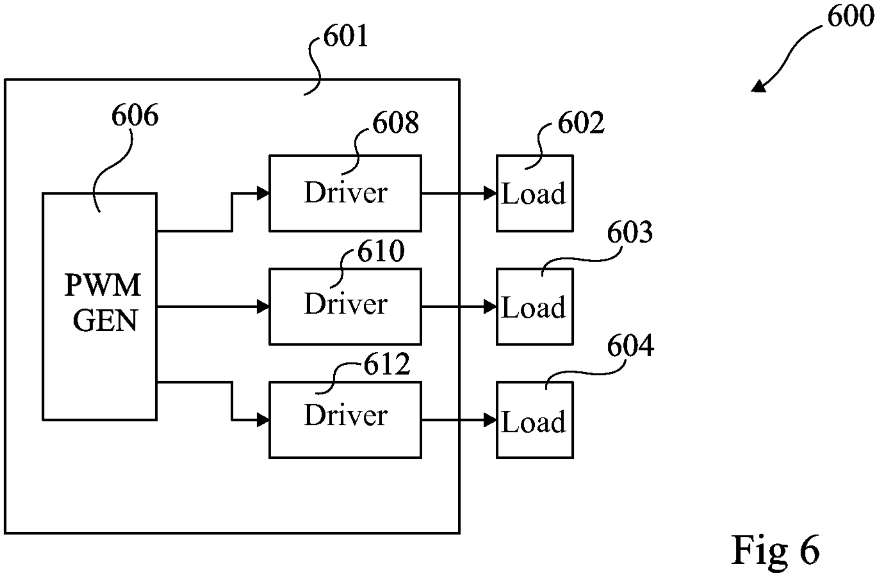
FIG. 6 illustrates electronic circuitry comprising drive circuits according to the present disclosure.

FIG. 6 illustrates electronic circuitry 600 comprising a supply module 601 for supplying electrical loads 602, 603 and 604. The supply module 601 comprises a PWM signal generator 606, which provides PWM signals to drive circuits 608, 610 and 612. The drive circuits 608 to 612 are for example each implemented by the circuit 300 of FIG. 3, with gate current control blocks according to one of the circuits of FIGS. 5A to 5D. The drive blocks 608 to 612 provide corresponding output signals to load 602, 603 and 604 respectively. The loads could for example be heating coils, lamps or other types of load. Obviously, the number of drive blocks 608 to 612 will depend on the number of loads to be driven, and in some cases more than one load could be supplied by the same drive block.

Figure 1:
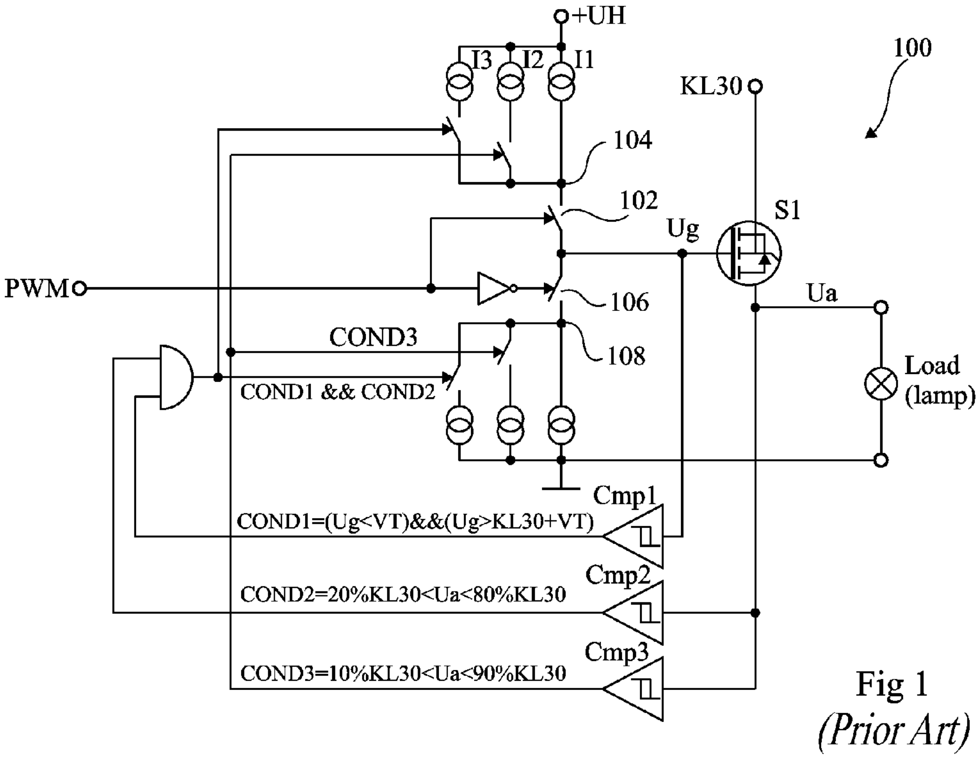
Fig 1 (Prior Art)
FIG. 1 (described above) illustrates a circuit 100 for driving a load.
Figure 2:
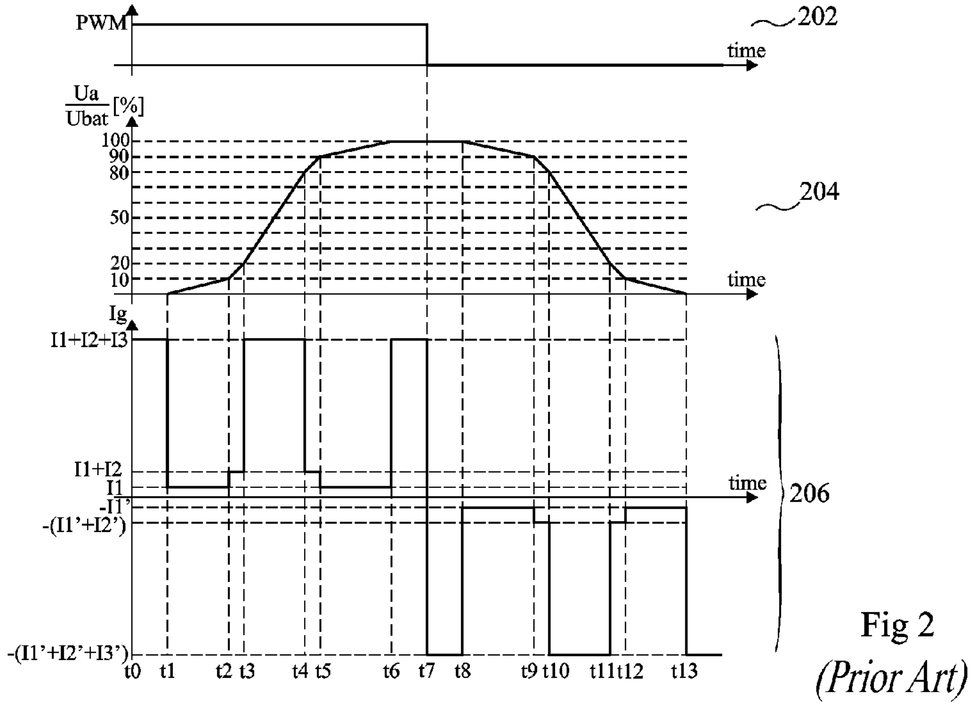
Fig 2 (Prior Art)
FIG. 2 (described above) shows timing diagrams of a PWM signal, the output voltage of the circuit of FIG. 1 as a percentage of the supply voltage, and the current levels applied in the circuit of FIG. 1.

An advantage of the embodiments described herein is that very low electromagnetic emission can be achieved with low switching losses. In particular, due at least in part to the continuous control of the variable current source 320, the output voltage during a PWM pulse varies in a smooth fashion, without the ridges present in the curve 204 of FIG. 2. Such ridges lead to high frequency electromagnetic emissions.

Furthermore, by controlling both charge and discharge of the power transistor gate using the same variable current source, a close matching can be achieved between the rising and falling curves of the output voltage. This helps to further reduce electromagnetic emissions.

Yet a further advantage is that by making the charge current proportional to the output voltage $V_{OUT}$, and making it monotonically increasing, a fast rise in output voltage can be achieved. Indeed, the current pattern illustrated by timing diagram 206 of FIG. 2 applies the maximum current at only certain points during charge of the transistor gate, and very low currents at other times, leading to high switching losses.

A further advantage of the embodiments described herein is that the implementation is simple, and comparators are not needed.

Having thus described at least one illustrative embodiment of the disclosure, various alterations, modifications and improvements will readily occur to those skilled in the art.

For example, while a number of examples of gate current control blocks have been provided in FIGS. 5A to 5D, it will be apparent to those skilled in the art that different circuits could be used. Furthermore, features of the circuits described could be combined in any combination.

Furthermore, various modifications to the circuit of FIG. 3 will occur to those skilled in the art. For example, it will be apparent to those skilled in the art that implementations using other forms of continuous functions, including non-linear functions, for controlling the current I_DRIVE based on the output voltage $V_{OUT}$ or gate voltage $V_{GATE}$ would be possible.

While embodiments based on CMOS technology have been described, it will be apparent to those skilled in the art that implementations in other transistor technologies would be possible, such as bipolar transistors.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. Circuitry for controlling a power transistor of a drive circuit arranged to drive an electrical component, the circuitry comprising:

- a variable current source configured to set a level of a charging current for charging a control terminal of said power transistor;
- a control circuit configured to control said variable current source with a non-discrete, continuous first control signal based on a feedback voltage, wherein said variable current source is configured to set, based on the first control signal, both the level of said current for charging said control terminal of said power transistor and a level of a current for discharging said control terminal of said power transistor;
- a first current mirror arranged to supply said charging current for charging said control terminal of said power transistor based on the current through said variable current source;
- a second current mirror arranged to supply said discharging current for discharging said control terminal of said power transistor based on the current through said variable current source;
- a first switch configured to supply the charging current from the first current mirror to the control terminal of said power transistor in response to a second control signal having a first level; and
- a second switch configured to supply the discharging current from the control terminal of said power transistor to the second current mirror in response to the second control signal having a second level.

2. The circuitry of claim 1, wherein said variable current source is configured to generate a monotonically increasing current for charging said control terminal, under control of the control circuit.

3. The circuitry of claim 1, wherein said control circuit is configured to cause said variable current source to generate a monotonically decreasing current for discharging said control terminal.

4. The circuitry of claim 1, wherein said variable current source includes a transistor having a control terminal coupled to receive a control signal from said control circuit, and a fixed current source coupled in parallel with said transistor.

5. The circuitry of claim 1, wherein said control circuit comprises at least one resistor arranged to convert said feedback voltage into a feedback current level, and a third current mirror configured to set the level of current through the variable current source based on said feedback current level.

6. The circuitry of claim 1, wherein said control circuit comprises an operational amplifier configured to provide an output signal proportional to said feedback voltage.

7. The circuitry of claim 1, wherein said feedback voltage is one of:

- a voltage level supplied by said power transistor; and
- a voltage at the control terminal of said power transistor.

8. The circuitry of claim 1, wherein said current for charging the control terminal of said power transistor is equal to I_START+L($V_{REF}$), where I_START is a constant starting current value, L is a constant and $V_{REF}$ is a voltage level equal to said feedback voltage or proportional to said feedback voltage.

9. The circuitry of claim 1, wherein the first and second switches are arranged to respectively control the charging and discharging of said control terminal of said power transistor based on the second control signal, which is a pulse width modulation signal.

10. The circuitry of claim 1, wherein:

- the first current mirror includes first, second and third legs, the first leg including the current source coupled between first and second supply nodes and the third leg including the first switch coupled between the first supply node and an output node configured to be coupled to the control terminal of the power transistor; and
- the second current mirror includes first and second legs, the first leg of the second current mirror including a transistor coupled by the second leg of the first current mirror and a feedback node configured to receive the feedback voltage and the second leg of the second current mirror including the second switch which is coupled between the feedback node and the output node.

11. A drive circuit, comprising:

- a power transistor configured to drive a load and having a gate terminal;
- circuitry configured to control the power transistor, the circuitry including:
  - a variable current source having a terminal electrically coupled to the gate terminal of the power transistor and configured to set a level of a charging current that charges the gate terminal of said power transistor;
  - a control circuit configured to control said variable current source with a non-discrete, continuous first control signal based on a feedback voltage, wherein said variable current source is configured to set, based on the first control signal, both the level of said charging current and a level of a discharging current that discharges said gate terminal of said power transistor;
  - a first current mirror arranged to supply said charging current that charges said gate terminal of said power transistor based on the current through said variable current source, and
  - a second current mirror arranged to supply said discharging current that discharges said gate terminal of said power transistor based on the current through said variable current source.

12. The drive circuit of claim 11, wherein:

- the first current mirror includes a first leg coupled between a supply node and the variable current source, a second leg coupled to the supply node, and a third leg coupled between the supply node and the gate terminal of the power transistor; and the second current mirror includes a first leg coupled between an output terminal of the power transistor and the second leg of the first current mirror and a second leg coupled between the output and gate terminals of the power transistor.

13. The drive circuit of claim 12, wherein the third leg of the first current mirror includes a first control transistor and the second leg of the second current mirror includes a second control transistor, the first control transistor being configured to supply the charging current from the first current mirror to the gate terminal of said power transistor in response to a second control signal having a first level, and the second control transistor being configured to supply the discharging current from the gate terminal of said power transistor to the second current mirror in response to the second control signal having a second level.

14. The drive circuit of claim 11, wherein said control circuit comprises at least one resistor arranged to convert said feedback voltage into a feedback current level, and a current mirror configured to set the level of current through the variable current source based on said feedback current level.

15. The drive circuit of claim 11, wherein said variable current source is configured to generate a monotonically increasing current for charging said gate terminal, under control of the control circuit.

16. An electronic circuit comprising:

a pulse width modulation (PWM) signal generator configured to provide a PWM signal; and a drive circuit configured to drive a load based on the PWM signal generated by said generator, the drive circuit including:

a power transistor configured to drive the load and having a gate terminal;

circuitry configured to control the power transistor, the circuitry including:

a variable current source having a terminal electrically coupled to the gate terminal of the power transistors and configured to set a level of a charging current that charges the gate terminal of said power transistor;

a control circuit configured to control said variable current source with a non-discrete continuous signal based on a feedback voltage; and first and second switches arranged to control the charging and discharging of said gate terminal of said power transistor based on the PWM signal, wherein said variable current source is configured to set, based on the non-discrete continuous signal, both the level of said charging current and a level of a discharging current that discharges said gate terminal of said power transistor, the first switch being configured to supply the charging current to the gate terminal of said power transistor in response to the PWM signal having a first level, and the second switch being configured to supply the discharging current from the gate terminal of said power transistor in response to the PWM signal having a second level; and a first current mirror arranged to supply said charging current for charging said gate terminal of said power transistor based on the current through said variable current source, and a second current mirror arranged to supply the discharging current for discharging said gate terminal of said power transistor based on the current through said variable current source.

17. The electronic circuit of claim 16, wherein:

the first current mirror includes a first leg coupled between a supply node and the variable current source, a second leg coupled to the supply node, and a third leg coupled between the supply node and the gate terminal of the power transistor; and the second current mirror includes a first leg coupled between an output terminal of the power transistor and the second leg of the first current mirror and a second leg coupled between the output and gate terminals of the power transistor.

18. The electronic circuit of claim 17, wherein the third leg of the first current mirror includes the first switch and the second leg of the second current mirror includes the second switch.

19. The electronic circuit of claim 16, wherein said control circuit comprises at least one resistor arranged to convert said feedback voltage into a feedback current level, and a current mirror configured to set the level of current through the variable current source based on said feedback current level.

20. The electronic circuit of claim 16, wherein said variable current source is configured to generate a monotonically increasing current for charging said gate terminal, under control of the control circuit.

21. A method, comprising:

controlling a power transistor of a drive circuit to drive an electrical component, the controlling including:

setting, by a variable current source, a level of a charging current and using the charging current to charge a gate terminal of said power transistor; and controlling said variable current source with a non-discrete continuous signal based on a feedback voltage; and setting, by the variable current source, a level of a discharging current for discharging said gate terminal of said power transistor, wherein setting the level of the charging current for charging said gate terminal and setting the level of the discharging current for discharging said gate terminal are each performed in response to the same non-discrete continuous control signal, wherein:

setting, by the variable current source, the level of the charging current includes producing the charging current by mirroring a current provided by the variable current source;

using the charging current to charge the gate terminal of said power transistor includes providing the charging current through a first control switch to the gate terminal in response to a control terminal of the first control switch being controlled by a control signal at a first level;

setting, by the variable current source, the level of the discharging current includes producing the discharging current by mirroring the current provided by the variable current source; and discharging said gate terminal of said power transistor by providing the discharge current from the gate terminal through a second control switch in response to a control terminal of the second control switch being controlled by the control signal at second level.

22. The method of claim 21, wherein the controlling includes causing said variable current source to generate a monotonically increasing current for charging said gate terminal.

23. The method of claim 21, wherein the controlling includes causing said variable current source to generate a monotonically decreasing current for discharging said gate terminal.

* * * * *